(12) United States Patent
Wada et al.

(10) Patent No.: US 7,101,725 B2
(45) Date of Patent: Sep. 5, 2006

(54) SOLUTION TO THERMAL BUDGET

(75) Inventors: Yuichi Wada, Tomisato (JP); Francisco A. Leon, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 46 days.

(21) Appl. No.: 10/896,754

(22) Filed: Jul. 22, 2004

(65) Prior Publication Data

US 2005/0054131 A1    Mar. 10, 2005

Related U.S. Application Data

(60) Provisional application No. 60/489,321, filed on Jul. 23, 2003.

(51) Int. Cl.
    *H01L 21/00* (2006.01)
(52) U.S. Cl. .................. 438/65; 257/E21.529
(58) Field of Classification Search ............ 438/5, 438/14, 65
    See application file for complete search history.

(56) References Cited

U.S. PATENT DOCUMENTS

| | | | |
|---|---|---|---|
| 3,217,856 A | 11/1965 | Miles |
| 4,006,432 A | 2/1977 | Streifer et al. |
| 4,100,562 A | 7/1978 | Sugawara et al. |
| 4,368,481 A | 1/1983 | Ohashi et al. |
| 4,438,447 A | 3/1984 | Copeland, III et al. |
| 4,720,468 A | 1/1988 | Menigaux et al. |
| 4,734,910 A | 3/1988 | Izadpanah |
| 4,759,023 A | 7/1988 | Yamaguchi |
| 4,871,224 A | 10/1989 | Karstensen et al. |
| 4,959,540 A | 9/1990 | Fan et al. |
| 4,966,430 A | 10/1990 | Weidel |
| 4,969,712 A | 11/1990 | Westwood et al. |
| 4,980,568 A | 12/1990 | Merrick et al. |
| 5,098,861 A | 3/1992 | Blackstone |
| 5,190,883 A | 3/1993 | Menigaux et al. |
| 5,193,131 A | 3/1993 | Bruno |
| 5,195,161 A | 3/1993 | Adar et al. |
| 5,291,010 A | 3/1994 | Tsuji |
| 5,298,787 A | 3/1994 | Bozler et al. |
| 5,345,557 A | 9/1994 | Wendt |
| 5,357,122 A | 10/1994 | Okubora et al. |
| 5,382,810 A | 1/1995 | Isaksson |

(Continued)

FOREIGN PATENT DOCUMENTS

EP    0 661 561 A2    12/1994

(Continued)

OTHER PUBLICATIONS

Kimerling, 2000, "Photons to the rescue: Microelectronics becomes microphotonics", The Elec. Soc. Interface, Summer, pp. 28-31.

(Continued)

*Primary Examiner*—W. David Coleman
(74) *Attorney, Agent, or Firm*—Wilmer Cutler Pickering Hale & Dorr

(57) ABSTRACT

A method of fabricating on optical detector, the method including providing a substrate that includes an optical waveguide formed therein and having a surface for fabricating microelectronic circuitry thereon; fabricating microelectronic circuitry on the substrate, the fabricating involving a plurality of sequential process phases; after a selected one of the plurality of sequential process phases has occurred and before the next process phase after the selected one of the plurality of process phases begins, fabricating an optical detector within the optical waveguide; and after fabricating the optical detector in the waveguide, completing the plurality of sequential process phases for fabricating the microelectronic circuitry.

16 Claims, 13 Drawing Sheets

U.S. PATENT DOCUMENTS

| | | | |
|---|---|---|---|
| 5,418,360 | A | 5/1995 | Sokolowska et al. |
| 5,463,229 | A | 10/1995 | Takase et al. |
| 5,485,021 | A | 1/1996 | Abe |
| 5,523,557 | A | 6/1996 | Bruno |
| 5,536,974 | A | 7/1996 | Nishiguchi |
| 5,548,433 | A | 8/1996 | Smith |
| 5,569,934 | A | 10/1996 | Fujii et al. |
| 5,604,361 | A | 2/1997 | Isaksson |
| 5,633,527 | A | 5/1997 | Lear |
| 5,652,811 | A | 7/1997 | Cook et al. |
| 5,663,592 | A | 9/1997 | Miyazawa et al. |
| 5,728,605 | A | 3/1998 | Mizutani |
| 5,767,508 | A | 6/1998 | Masui et al. |
| 5,801,872 | A | 9/1998 | Tsuji |
| 5,812,708 | A | 9/1998 | Rao |
| 5,825,051 | A | 10/1998 | Bauer et al. |
| 5,828,679 | A | 10/1998 | Fisher |
| 5,854,804 | A | 12/1998 | Winer et al. |
| 5,889,903 | A | 3/1999 | Rao |
| 5,945,720 | A | 8/1999 | Itatani et al. |
| 5,946,438 | A | 8/1999 | Minot et al. |
| 5,970,081 | A | 10/1999 | Hirayama et al. |
| 5,987,196 | A | 11/1999 | Noble |
| 6,011,296 | A | 1/2000 | Hassard et al. |
| 6,031,243 | A | 2/2000 | Taylor |
| 6,043,515 | A | 3/2000 | Kamiguchi et al. |
| 6,066,860 | A | 5/2000 | Katayama et al. |
| 6,093,939 | A | 7/2000 | Artigue et al. |
| 6,125,217 | A | 9/2000 | Paniccia et al. |
| 6,202,165 | B1 | 3/2001 | Pine |
| 6,232,142 | B1 | 5/2001 | Yasukawa |
| 6,288,410 | B1 | 9/2001 | Miyazawa |
| 6,310,372 | B1 | 10/2001 | Katayama et al. |
| 6,318,901 | B1 | 11/2001 | Heremans et al. |
| 6,320,204 | B1 | 11/2001 | Hirabayashi et al. |
| 6,343,171 | B1 | 1/2002 | Yoshimura et al. |
| 6,346,717 | B1 | 2/2002 | Kawata |
| 6,392,342 | B1 | 5/2002 | Parikka |
| 6,393,183 | B1 | 5/2002 | Worley |
| 6,403,395 | B1 | 6/2002 | Hirabayashi et al. |
| 6,407,438 | B1 | 6/2002 | Severn |
| 6,449,411 | B1 | 9/2002 | Nakamura |
| 6,528,779 | B1 | 3/2003 | Franz et al. |
| 6,555,841 | B1 | 4/2003 | Sakushima et al. |
| 6,645,829 | B1* | 11/2003 | Fitzergald .................. 438/455 |
| 6,647,350 | B1* | 11/2003 | Palfenier et al. ............ 702/134 |
| 6,658,173 | B1 | 12/2003 | Delwala |
| 6,677,655 | B1 | 1/2004 | Fitzergald .................. 257/432 |
| 6,680,495 | B1 | 1/2004 | Fitzergald .................. 257/183 |
| 6,767,751 | B1* | 7/2004 | Hunter ......................... 438/5 |
| 2002/0146865 | A1 | 10/2002 | Hoel |
| 2002/0174826 | A1 | 11/2002 | Maydan et al. ............... 117/84 |
| 2002/0174827 | A1 | 11/2002 | Samoilov et al. ............ 117/84 |
| 2002/0181825 | A1 | 12/2002 | Johnson et al. |
| 2003/0015720 | A1 | 1/2003 | Lian et al. |
| 2003/0025118 | A1 | 2/2003 | Yamazaki et al. |
| 2003/0052082 | A1 | 3/2003 | Khan et al. |
| 2003/0052088 | A1 | 3/2003 | Khan et al. |
| 2003/0072548 | A1 | 4/2003 | Bhardwaj et al. |
| 2003/0110808 | A1 | 6/2003 | M'Saad et al. ............... 65/379 |
| 2003/0113085 | A1 | 6/2003 | M'Saad ..................... 385/129 |
| 2003/0114006 | A1 | 6/2003 | White |
| 2004/0012041 | A1 | 1/2004 | West |
| 2004/0013338 | A1 | 1/2004 | Bjorkman et al. |
| 2004/0114853 | A1* | 6/2004 | Bjorkman et al. ............ 385/14 |
| 2005/0023656 | A1* | 2/2005 | Leedy ........................ 257/678 |
| 2005/0072979 | A1 | 4/2005 | West et al. |

FOREIGN PATENT DOCUMENTS

| | | |
|---|---|---|
| EP | 0 661 561 A3 | 12/1994 |
| WO | WP 03/036369 A1 | 5/2003 |

OTHER PUBLICATIONS

Chen et al., "Fully Embedded Board-Level Guided-Wave Optoelectronic Interconnects," Proceedings of the IEEE, vol. 88, No. 6, Jun. 2000, pp. 780-793.

Choi et al., "Self-Aligning Silicon Groove Technology Platform for the Low Cost Optical Module," 1999 Electronic Components and Technology Conference, IEEE, 1999, pp. 1140-1144.

Irace et al., "Fast Silicon-on-Silicon Optoelectronic Router Based on a BMFET Device," IEEE Journal of Selected Topics in Quantum Electronics, vol. 6, No. 1, Jan./Feb. 2000, pp. 14-18.

Jalali et al., "Advances in Silicon-on-Insulator Optoelectronics," IEEE Journal of Selected Topics in Quantum Electronics, vol. 4, No. 6, Nov./Dec. 1998, pp. 938-947.

Janz et al.(1998) "Optical Properties of Pseudomorphic $Si_{1-x}GE_x$ for Si-Based Waveguides at the $\lambda$=1300-nm and 1550-nm Telecommunications Wavelength Bands", IEEE Journal of Selected Topics in Quantum Electronics. vol. 4 (6), pp. 990-996.

Kostal, "Nano-optics Changes the Rules for Optical Components," NanoOpto White Paper 2002.001, Jun. 2002, pp. 1-6.

Kostal and Park, "Nano-optics: New Rules for Optical System Design," NanoOpto White Paper 2002.002, Jun. 2002, pp. 1-10.

Motorola Labs, "The Discovery: Motorola Labs solves a 30-year semiconductor industry puzzle," Jun. 2002.

Schaub et al., "High-Speed Monolithic Silicon Photoreceivers on High Resistivity and SOI Substrates," Journal of Lightwave Technology, vol. 19, No. 2, Feb. 2001, pp. 272-278.

Shuppert et al. (1989) "Optical Channel Waveguides in Silicon Diffused from GeSi Alloy". Electronics Letters. vol. 25 (22), pp. 1500-1502.

Soref et al. (1990) "Optical Waveguiding in a Single-crystal Layer if Germanium Silicon Grown on Silicon" Optics Letters. vol. 15(5), pp. 270-272.

Soref et al. (1991) "Large Single-Mode Rib Waveguides in GeSi-Si and Si-on-$SiO_2$" IEEE Journal of Quantum Electronics. vol. 27 (8), pp. 1971-1974.

Splett et al. (1990) "Low Loss Optical Ridge Waveguides in a Strained GeSi Epitaxial Layer Grown on Silicon". Electronics Letters, vol. 26(14), pp. 1035-1037.

Tashiro et al., "A Selective Epitaxial SiGe/Si Planar Photodector for Si-Based OEIC's," IEEE Transactions on Electron Devices, vol. 44, No. 4, Apr. 1997, pp. 545-550.

Walker and Jahns, "Optical clock distribution using integrated free-space optics," Optics Communications 90 (1992) pp. 359-371.

Walker et al., "Design and fabrication of high-efficiency beam splitters and beam deflectors for integrated planar micro-optic systems," Applied Optics, vol. 32, No. 14, May 10, 1993, pp. 2494-2501

Yabu et al., "New Design Method for Low-Loss Y-Branch Waveguides," Journal of Lightwave Technology, vol. 19, No. 9, Sep. 2001, pp. 1376-1384.

* cited by examiner

SOLUTION TO THERMAL BUDGET

This application claims the benefit of U.S. Provisional Application No. 60/489,321, filed Jul. 23, 2003.

TECHNICAL FIELD

The invention relates generally to the fabrication of optical detectors for use in buried optical waveguides within a semiconductor substrate on which microelectronics are fabricated using conventional semiconductor fabrication techniques.

BACKGROUND

As features on microelectronic circuits become smaller and as device speeds increase, we have been fast approaching the limits inherent in the electrical communication of signals. The capacitances in the microelectronic circuits along the electrical connections cause delays that cannot be ignored. More and more sophisticated techniques have been required to circumvent or push back these limitations. One direction in which people have turned their efforts has been to use photons instead of electrons to communicate information. Optical signals are not affected by capacitance, inductance, and ohmic resistance that are present in the circuit elements and photons travel much faster than the electrons. As a consequence, in recent years there have been many advances in the field of optical communication and processing of signals and in optical media and devices that enable that optical communication and processing.

These efforts have also had their impact on the integrated circuit fabrication industry as more people search for ways to combine or integrate photonic elements with the microelectronic devices that have been fabricated on IC chips. There have been many recent advances involving the fabrication of optical waveguide structures on silicon substrates, the fabrication of photodetectors to convert the light to electrical signals that can be used by conventional microelectronic circuitry and the fabrication of light emitters or laser elements for converting the electrical signals to optical signals.

SUMMARY

In general, in one aspect, the invention features a method of fabricating an optical detector. The method involves providing a substrate that includes an optical waveguide formed therein and having a surface for fabricating microelectronic circuitry thereon; fabricating microelectronic circuitry on the surface of the substrate through use of a plurality of sequential process phases; after a selected one of the plurality of sequential process phases has occurred and before the next process phase after the selected one of the plurality of process phases begins, fabricating an optical detector within the optical waveguide; and after fabricating the optical detector in the waveguide, completing the plurality of sequential process phases for fabricating the microelectronic circuitry.

Embodiments include one or more of the following aspects. The optical detector has a thermal budget associated therewith and the selected process phase is chosen so that completing the plurality of sequential process phases after fabricating the optical detector does not exceed the thermal budget of the optical detector. The microelectronic circuitry being fabricated also has a thermal budget associated therewith and the selected process phase is chosen so that fabricating the optical detector does not exceed the thermal budget for the microelectronic circuitry being fabricated. Alternatively, the selected process phase is chosen so that completing the plurality of sequential process phases after fabricating the optical detector does not damage the optical detector and/or it is chosen so that fabricating the optical detector does not damage the microelectronic circuitry being fabricated. Fabricating the optical detector involves employing a maximum process temperature of T(1)max and the selected process phase is chosen to be one of the plurality of process phases during which exposing the substrate to the process temperature of T(1)max will not damage the microelectronic circuitry that is being fabricated on the substrate and after which exposing the substrate to a process temperature of T(1)max will damage microelectronic circuitry that is being fabricated on the substrate. Process temperatures that are greater than T(1)max are will damage the optical detector, so the selected process phase is chosen to be one of the plurality of process phases after which the substrate will be exposed to process temperatures that are no greater than T(1)max. Fabricating the microelectronic circuitry is in accordance with CMOS fabrication techniques. The plurality of sequential process phases includes a silicide phase and the selected one of the process phases occurs before the silicide phase. The plurality of sequential process phases includes a thermal treatment to diffuse in dopants in drains and sources of CMOS devices and the selected one of the process phases is the thermal treatment phase.

In general, in another aspect, the invention features a method of fabricating on optical detector that involves providing a substrate that includes an optical waveguide formed therein and having a surface for fabricating microelectronic circuitry thereon; in accordance with a CMOS fabrication process including a plurality a sequential process phases, fabricating microelectronic circuitry on the substrate, said CMOS fabrication; after a selected one of said plurality of sequential process phases has occurred and before the next process phase after said selected one of said plurality of process phases begins, fabricating an optical detector within the optical waveguide; and after fabricating the optical detector in the waveguide, completing the plurality of sequential process phases for fabricating the microelectronic circuitry.

Embodiments include one or more of the following aspects. The plurality of sequential process phases includes a silicide phase and the selected one of the process phases occurs before the silicide phase. The plurality of sequential process phases includes a thermal treatment to diffuse in dopants in drains and sources of CMOS devices and the selected one of the process phases is the thermal treatment phase.

Other features and advantages of the invention will be apparent from the following detailed and from the claims.

DETAILED DESCRIPTION

Because the CMOS (complementary-metal-oxide-semiconductor) LSI (large scale integration) fabrication paradigm is so well rooted, integrating optical networking into the CMOS LSI fabrication process calls for subtle insertion techniques so as to avoid having to retool the CMOS wafer processing. One approach that is being explored involves optical ready substrates into which the CMOS circuitry is later fabricated. Examples of this approach are described in U.S. patent application Ser. No. 10/280,505, filed Oct. 25, 2002, entitled "Optical Ready Substrates," and U.S. patent application Ser. No. 10/280,492, filed Oct. 25, 2002, entitled "Optical Ready Wafers," both of which are incorporated herein by reference.

In essence, the underlying principle behind optical ready substrates is that the optical signal distribution network is provided in such a way that its fabrication and the fabrication of the microelectronic circuitry are done totally or largely independently of each other.

The optical ready substrates provide a platform upon which electrical circuitry can subsequently be fabricated using conventional semiconductor fabrication techniques. By separating the fabrication of the optical signal distribution circuitry from the fabrication of the microelectronic circuitry in this way, the semiconductor microelectronics manufacturer can avoid having to develop a new technology or know-how for fabricating optical components on a semiconductor wafer. The semiconductor microelectronics manufacturer also avoids having to optimize its processes for fabricating the semiconductor electronics so as to also accommodate the fabrication of the optical components. Thus, for example, a company making CMOS circuitry that has optimized its fabrication processes for achieving ultra high precision and very high yields need not be concerned with having to modify its processes and possibly compromise its ultra high precision and high yields to also make optical elements along with the electrical components. In short, the semiconductor microelectronics manufacturer can simply rely on the expertise of an optical fabrication company to provide the optical elements and to optimize those processes and can, except for locating and making connections to the underlying optical signal distribution network, process the wafer just as though it was a blank semiconductor wafer. Of course, that is the ideal. In practice, the separation between the two technologies may not be as clean as that.

Figure 1:
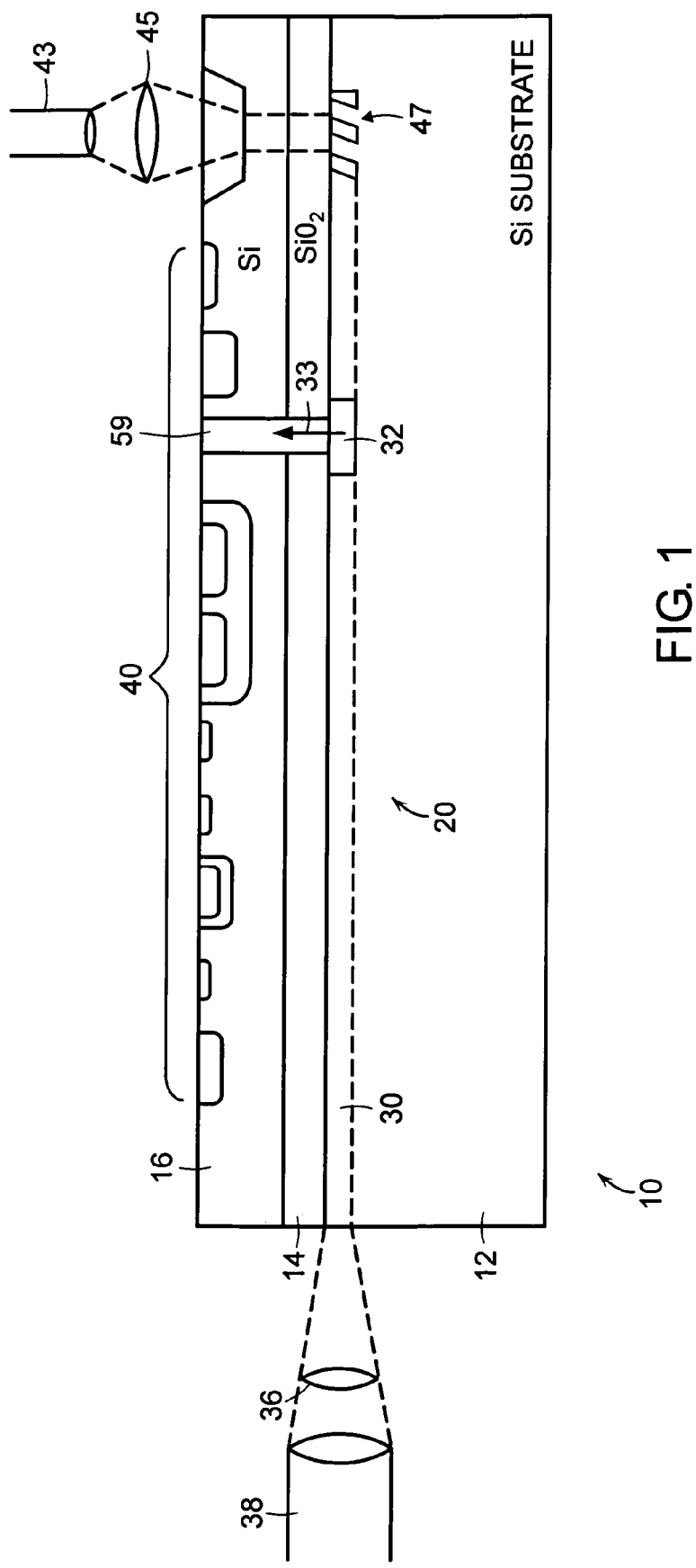
FIG. 1 is a schematic representation of an optical ready substrate.

FIG. 1 illustrates one example of an optical ready substrate 10. It contains a semiconductor integrated optical signal distribution network 20 for distributing an optical clock signal to semiconductor integrated microelectronic circuitry 40 that will be later fabricated on the substrate above the optical circuitry. In this described embodiment, optical ready substrate 10 is an SOI (silicon-on-insulator) structure that includes a base substrate 12 of crystalline silicon, an insulating layer 14 of $SiO_2$, and a thin upper layer 16 of crystalline silicon. (Structures other than an SOI structure can also be used. For example, the structure can be an optical ready epi-substrate that is either grown or produced by a layer transfer process.) Optical signal distribution network 20 is fabricated in substrate 12 just below insulating layer 14. Network 20 includes two fundamental building blocks, namely, optical waveguides 30 for distributing the optical signals between different locations on the chip and photodetectors 32 for converting the optical signals to electrical signals 33 that will be used by corresponding components of the microelectronic circuitry.

In the embodiment shown in FIG. 1, the optical signal is introduced using an edge coupling approach. A lens arrangement 36 focuses light from an external optical fiber 38 into optical waveguide 30. Note that in this embodiment, all of the required optical circuit elements are located within optical signal distribution network 20 and the only signals that are provided to the microelectronic circuit by the optical network are electrical signals generated by photodetectors 32 within the buried optical network.

The particular material used for the optical waveguides shown in FIG. 1 is SiGe. This combination of materials is particularly good due to its ability to yield low defect crystalline surfaces, which, as shall become apparent, is relevant to some other embodiments described below. A small amount of Ge can be added to a crystal layer during growth to create a higher index waveguide core, while minimizing strain and defects. This layer can be patterned and silicon can again be grown on top of this waveguide by other techniques. Various techniques for fabricating waveguides in a silicon substrate are known in the art. For a general discussion of this technology see "Photons to the Rescue: Microelectronics Becomes Microphotonics," L. C. Kimerling, The Electrochemical Society Interface, Summer 2000 (pp. 28–31). For a more specific discussion of some fabrication techniques see the following four U.S. patent applications that are assigned to Applied Materials Inc.: (1) U.S. Ser. No. 10/020,461, entitled "Method Of Manufacturing An Optical Core," filed Dec. 14, 2001; (2) U.S. Ser. No. 10/017,033, entitled "HDP-CVD Film For Uppercladding Application In Optical Waveguides," filed Dec. 14, 2001; (3) U.S. Ser. No. 09/866,172, entitled "Method For Fabricating Waveguides," filed May 24, 2001; and (4) U.S. Ser. No. 10/014,466, entitled "Waveguides Such As SiGeC Waveguides And Method Of Fabricating The Same," filed Dec. 11, 2001. All four of these U.S. patent applications are incorporated herein by reference.

With this model, an issue arises when a CMOS LSI process is used to fabricate the microelectronic circuitry on top of the optical ready substrate. During traditional CMOS LSI fabrication, the wafer will be subjected to a high temperature anneal (e.g., 1050° C.). The photodetectors 32 that are in the optical ready substrate must be able to withstand these high process temperatures. However, some of the detectors that might normally be viewed as candidates for use in the optical ready substrate will not survive temperatures that high. So on first glance that might appear to disqualify them as viable candidates for use with waveguides in the optical ready substrate. However, we have recognized that there is a small window of opportunity within the CMOS LSI process itself to fabricate such detectors. It occurs immediately after the high-T anneal and before any other structures are fabricated that might be damaged by the processing conditions required for fabricating the optical detectors (e.g. process temperatures as high as about 650° C.). Admittedly, moving the fabrication of the detectors into the CMOS LSI process phase compromises some of the advantages of the optical ready substrate associated with being able to completely separate these two fabrication phases. However, it is believed that those compromises are not so great as to offset the benefits on incorporating optical networking into the traditional CMOS fabrication process.

Figure 2:
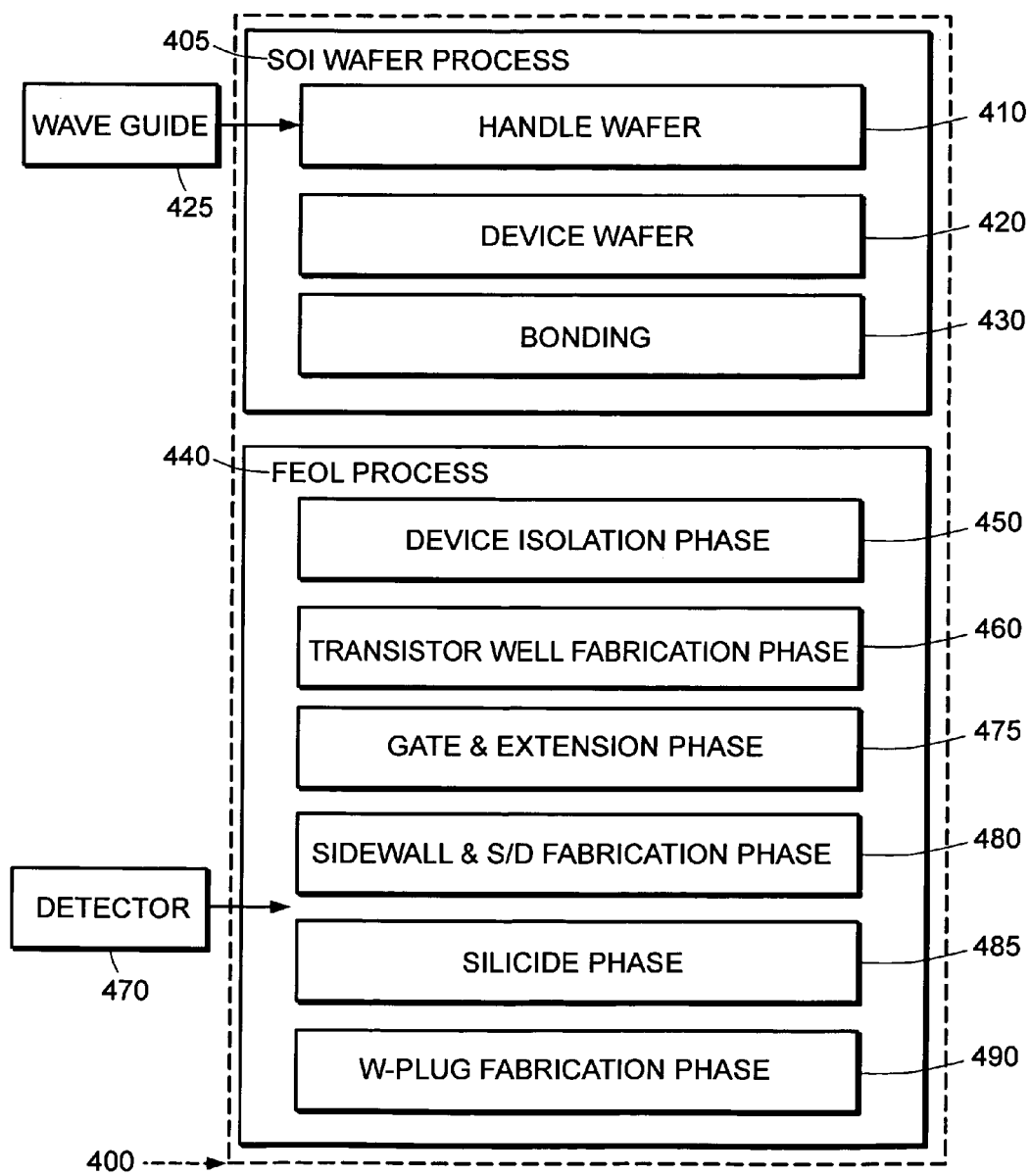
FIG. 2 is a flow chart of a fabrication process showing when optical detector fabrication takes place.

FIG. 2 presents a high level flow diagram of the optical ready substrate fabrication process followed by a CMOS fabrication process, modified to include fabrication of the detectors (see block 470). The first part of the process, represented by blocks 410, 420, and 430, is an epitaxial bonded wafer process 405 that relates to fabricating the optical ready substrate onto which the microelectronic circuitry will later be fabricated using a CMOS LSI process.

There are alternative processes that do not rely on SOI wafers. For example, one such process might simply use the handle wafer as the silicon substrate in which waveguides are fabricated, without the need for processes represented by blocks 420 and 430 in which the SOI layer is created on the device layer and bonded to the handle wafer. If this silicon substrate has excess defects from the waveguide patterning; those defects will need to be removed through high temperature anneals or other process controls. If the desired defect level is not achievable on a direct silicon substrate, but a silicon substrate (not SOI) is nevertheless desired, then a layer of low defect silicon can be manufactured by the same processes as shown in steps 420 and 430, but without adding the oxide insulator of the SOI layer before bonding.

The second part of the process, represented by blocks 450, 460, 475, 480, 485, and 490, relates to a front end of line (FEOL) process 440 within the overall CMOS LSI process.

In the first part of the process (i.e., the SOI wafer process 405), block 410 involves making the handle wafer in which the optical waveguides and other optical components are fabricated. Block 420 involves making the device wafer which will be attached to the handle wafer and thereby provide a surface into which the microelectronic circuitry can later be fabricated. And block 430 represents bonding the device wafer to the handle wafer and preparing the semiconductor surface for subsequent CMOS fabrication of the electronic circuitry. The phases of this process were generally described above. It is during this SOI wafer process 440 that the SiGe optical waveguides are fabricated into the handle wafer using techniques such as those mentioned above.

In the second part of the process (i.e., the FEOL process 440), we have divided the well-known CMOS fabrication process into different general fabrication phases during which certain types of fabrication are performed. The general function that is performed during each phase of the CMOS fabrication process is as follows. Block 450 involves isolating the regions in the substrate for the different devices. Block 460 involves fabricating the transistor wells. Block 475 involves fabricating the gates and the source and drain extensions. Block 480 involves fabricating the sidewalls and the sources and drains of the transistors. Block 470, which immediately follows block 480, involves fabricating the optical detectors (e.g. SiGe super lattice detectors) down in the waveguides that are in the optical ready substrate below the semiconductor into which the CMOS devices are being fabricated. Block 485 involves a silicide process to produce the ohmic contacts to the gates, sources, and drains. And block 490 involves fabricating the tungsten plugs (i.e., W-plugs) in vias that extend down to the ohmic contact regions.

After the FEOL process is completed, the Back End of Line (BEOL) phase begins in which the multiple layers of metalization are formed on top of the devices to interconnect them and to provide conductive paths for signals and power to the devices.

There are different ways of grouping the CMOS fabrication steps into fabrication phases or modules other than those illustrated in FIG. 2. The particular grouping and identification of boundaries between fabrication phases that has been selected is simply one example. It serves adequately to illustrate how the CMOS LSI process is modified to accommodate the fabrication of the optical detectors. How the steps are grouped or where the boundaries between phases are drawn is not of central importance, it is mainly where the steps for fabricating the optical detectors are inserted into the overall CMOS fabrication process that is of greatest importance.

Figure 3:
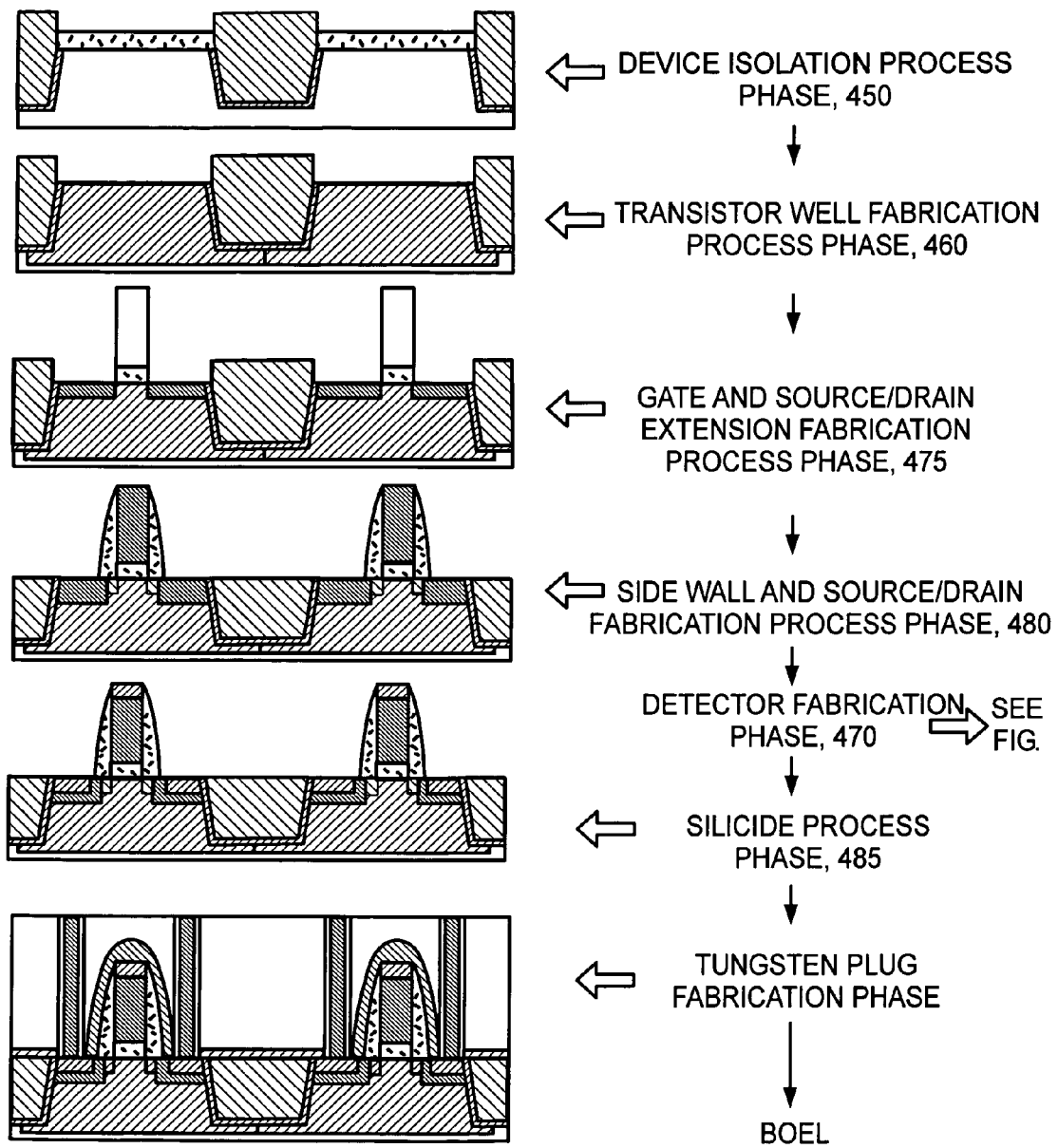
FIG. 3 is a flow chart showing the process phases of the Front End of Line (FEOL) portion of a typical CMOS LSI fabrication process that has been modified to include detector fabrication just before the silicide phase.

The principal steps that take place in each of the fabrication phases shown in FIGS. 2 and 3 will now be described in greater detail, starting with the device and isolation phase (block 450).

Figure 4A:
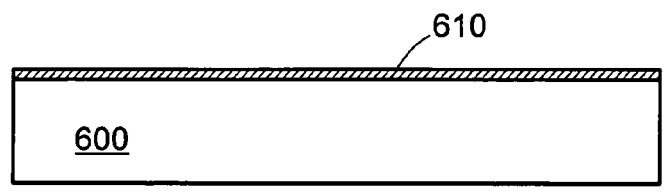
FIGS. 4A–I present a flow chart of the primary steps of the device isolation phase.

Referring to FIGS. 4A–I, at the beginning of the device isolation phase (block 450), a layer of silicon dioxide 610 is formed on the surface of a wafer of silicon 600 (see FIG. 4A). Note that silicon substrate 600 corresponds to upper layer 16 of crystalline silicon shown in FIG. 1. That is, silicon substrate 600 sits on top of the substrate in which the optical network has been fabricated and in which the optical waveguides are located.

Figure 4B:
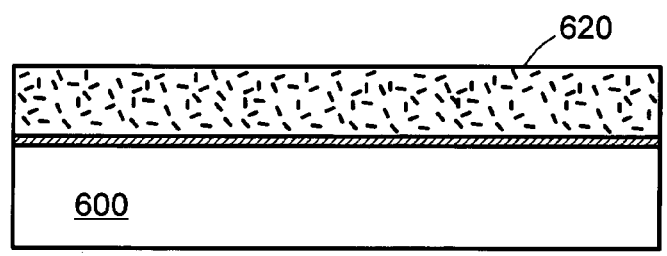
Figure 4C:
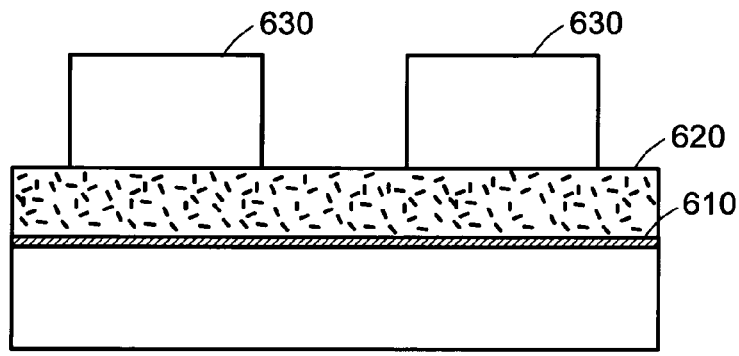
Figure 4D:
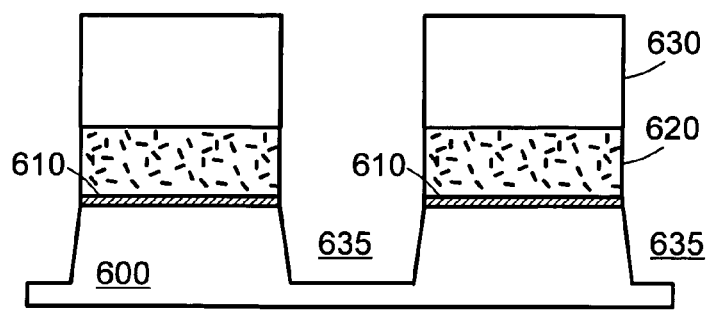
Figure 4E:
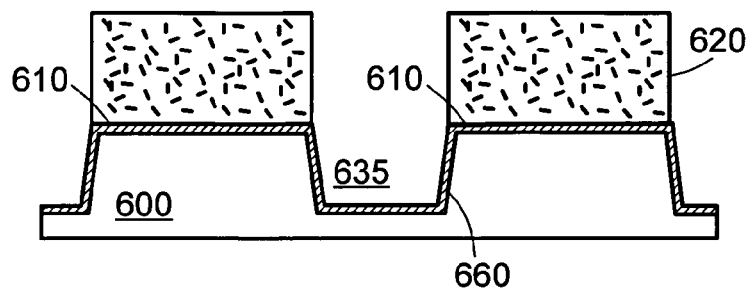

After the silicon dioxide layer is formed on the silicon, a thin film of silicon nitride 620 is deposited onto the silicon dioxide 610 (see FIG. 4B). This is typically done by using a chemical vapor deposition (CVD) reactor in which silane or dichlorosilane is reacted with ammonia at low gas pressures. The resulting silicon nitride 620 is then covered with a layer of photoresist 630 which is patterned using conventional photolithography techniques to produce a mask (see FIG. 4C) having openings in which the isolation trenches will be formed. A dry etch is then used to form shallow isolation trenches 635 in the open windows of the mask (see FIG. 4D). Typically, the dry etch process involves using two different gas mixtures. For example, the first gas mixture might be $CF_4/CHF_3/O_2$ that is used to form openings through the silicon nitride layer; and the second gas mixture might be $HBr/CL_2/O_2$ that is used to etch the trench in the silicon. (Of course, as is well known to persons of ordinary skill in the art, other gas mixtures are also possible.) After the trenches are formed, the photoresist 630 is removed (see FIG. 4E) and an oxide film layer 660 is formed by oxidizing the exposed silicon in the wafer (see FIG. 4E).

Figure 4F:
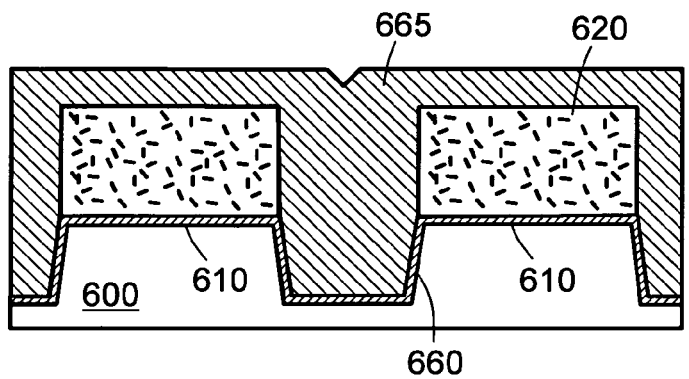
Figure 4G:
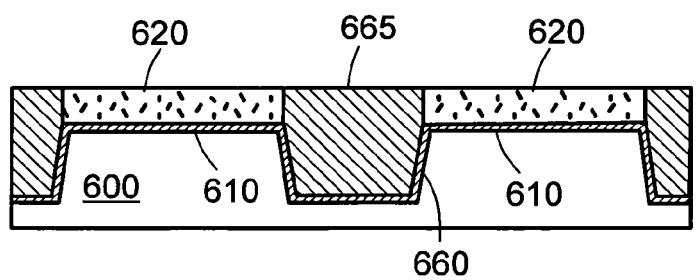
Figure 4H:
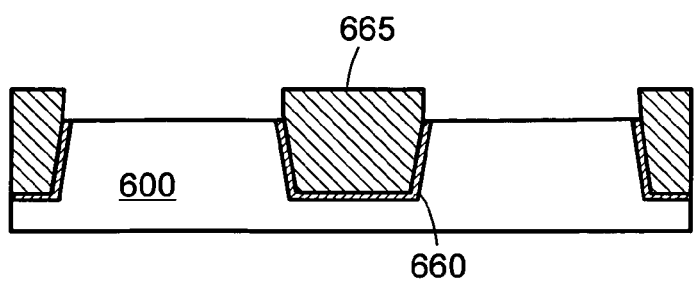
Figure 4I:
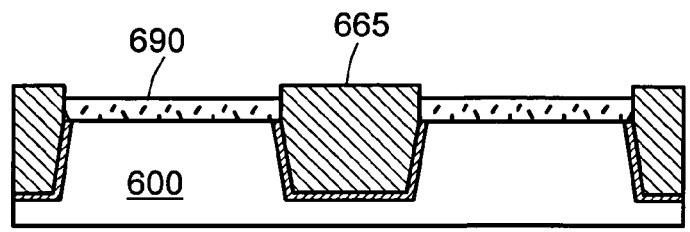

After the exposed silicon has been oxidized to form a thin oxide film 660, a CVD process is used to deposit a thicker layer of oxide 665 onto the wafer filling isolation trenches 635 (see FIG. 4F). Then, using a chemical mechanical polishing (CMP), the deposited layer of oxide 665 and an upper part of silicon nitride layer 620 is removed (see FIG. 4G). Next, the remaining silicon nitride layer 620 and the underlying silicon oxide film 610 is removed using a wet etch (e.g., phosphoric acid) (see FIG. 4H). Finally, a protective layer of sacrificial silicon dioxide 690 is grown on the exposed silicon to prevent metal contamination and/or damage to that surface during subsequent implantation phases (see FIG. 4I).

The transistor well fabrication process will now be described with reference to FIGS. 5A–F. During this sequence of process steps, an N-doped well region 510 and a P-doped well region 520 are fabricated. The N-well region is for pMOS field effect transistors and the P-well is for fabricating nMOS field effect transistors. To form N-well region 510, a photoresist layer 502 is formed on the wafer; it is patterned to expose areas in which the N-well regions will be formed; and then an n-type dopant 504 (e.g. arsenic or phosphorous) is implanted into the exposed areas (see FIG. 5A). After the implant is completed, the photoresist 502 is removed by using an asher and wet process. A similar sequence of steps is repeated to form P-well regions 520. More specifically, another photoresist layer 506 is formed on the wafer, it is patterned to expose areas in which the P-well regions will be formed, and then a p-type dopant 508 (e.g. boron) is implanted into the exposed areas (see FIG. 5B).

Figure 5A:
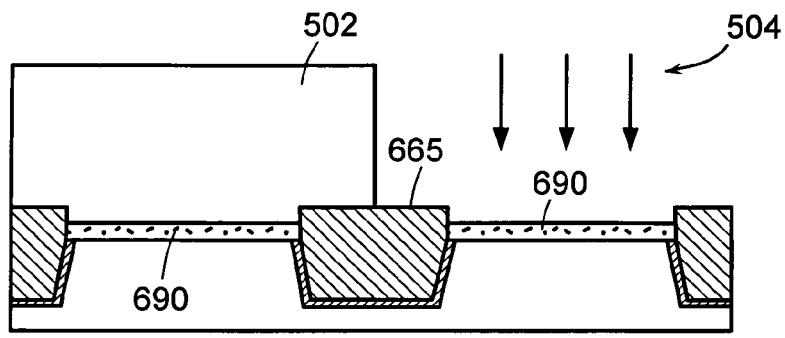
FIGS. 5A–F present a flow chart of the primary steps of the transistor well phase.
Figure 5B:
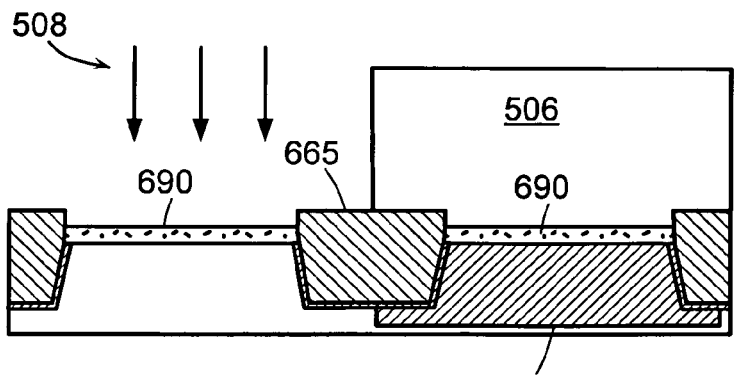
Figure 5C:
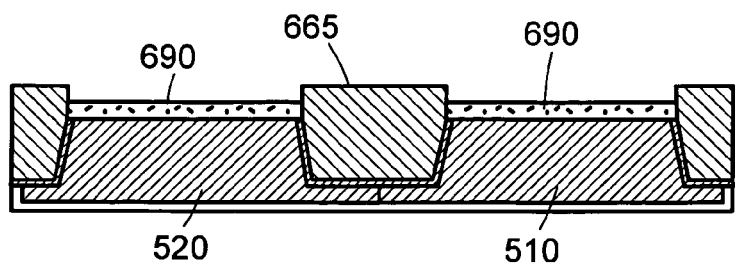
Figure 5D:
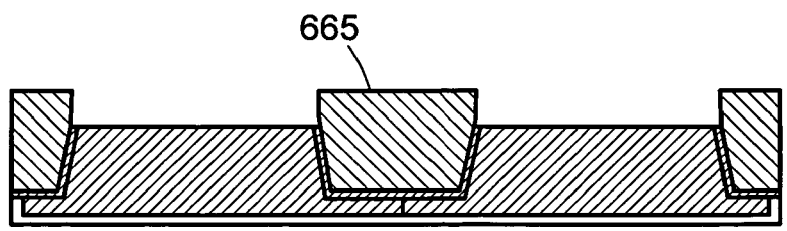

The completed transistor N-well 510 and P-well 520 are shown in FIG. 5C.

Figure 5E:
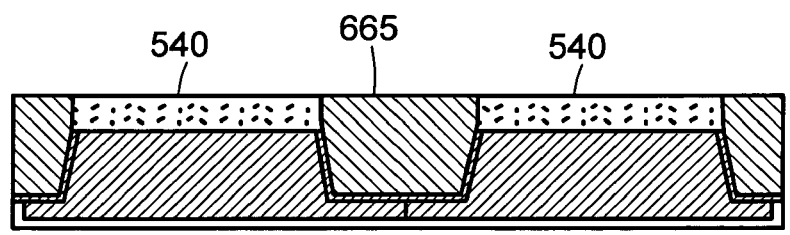
Figure 5F:
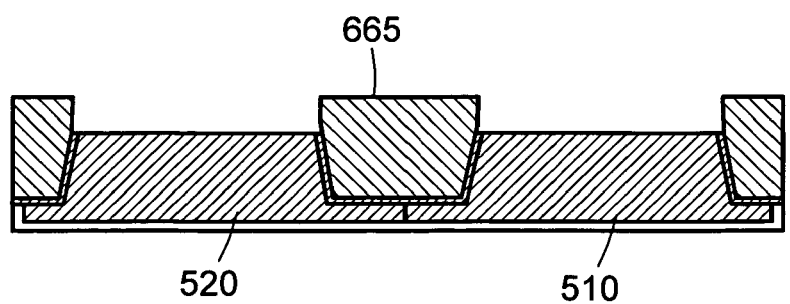

After the photoresist has been removed, the sacrificial oxide layer 690, which was deposited within the device isolation phase, is also removed (see FIG. 5D) and a thicker first gate oxide layer 540 is formed on the exposed surface (see FIG. 5E). This is for the purpose of producing a clean surface for the real gate oxide, which will soon be formed. The thicker oxide layer 540 is immediately removed by using a wet etching process to expose the surface of the well regions for forming the final gate oxide layer (see FIG. 5F).

The wafer is now ready for the forming the final gate oxides and the source and drain extensions. The details of the process for fabricating these elements are shown in FIGS. 6A–F. First, a thin film gate oxide 700 is formed on the exposed areas above the n-well and p-well regions 510 and 520 (see FIG. 6A). An oxidation furnace or a rapid thermal processing (RTP) system is used to form this high quality oxide layer.

Figure 6A:
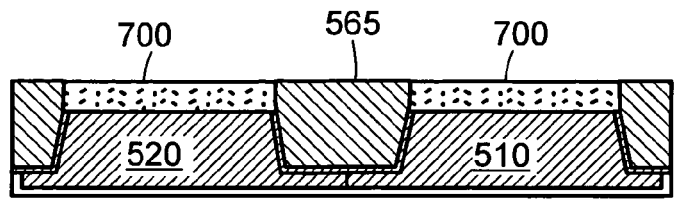
FIGS. 6A–H present a flow chart of the primary steps of the gate and source/drain extension phase.
Figure 6B:
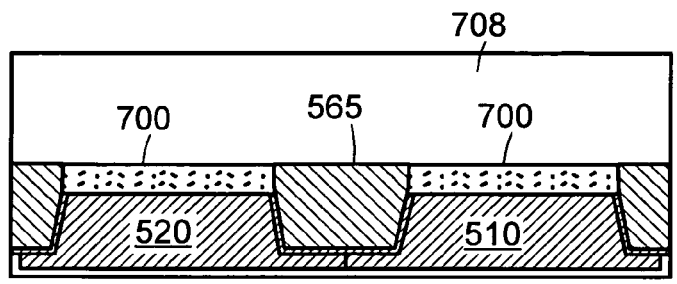
Figure 6C:
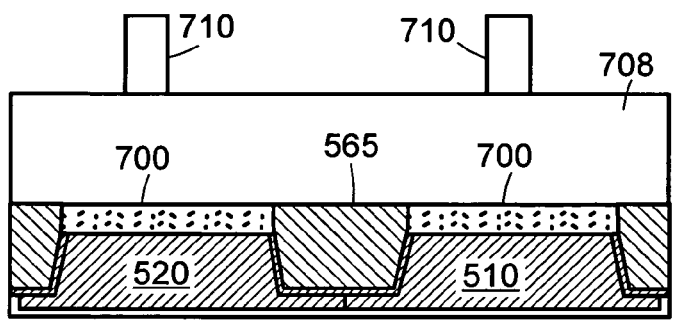
Figure 6D:
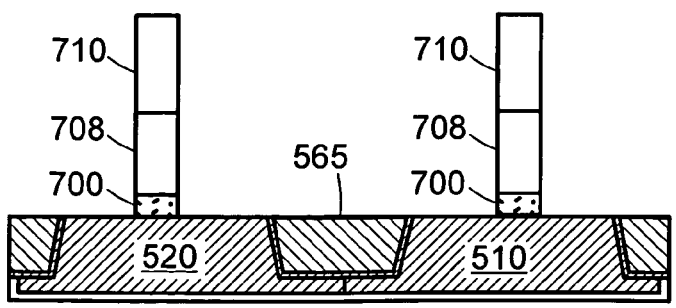
Figure 6E:
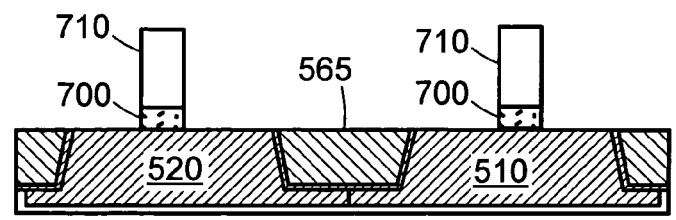
Figure 6F:
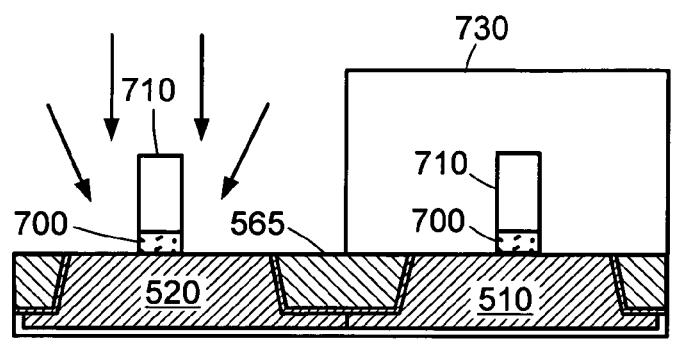
Figure 6G:
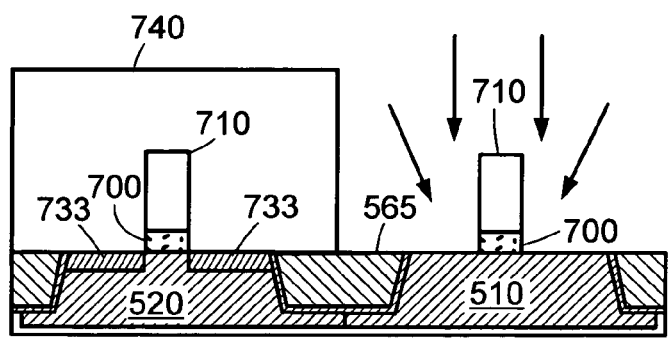
Figure 6H:
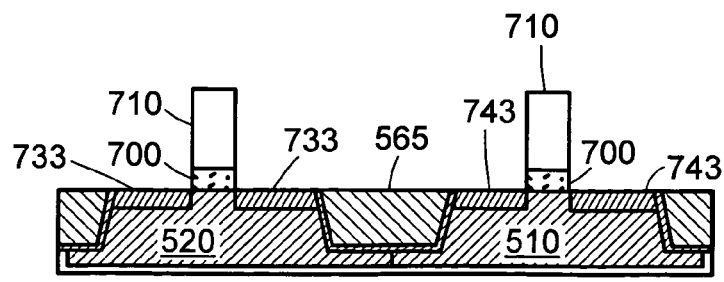
Figure 7A:
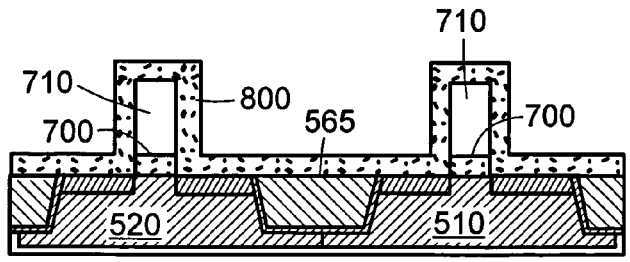
FIGS. 7A–E present a flow chart of the primary steps of the side wall and source/drain phase.
Figure 7B:
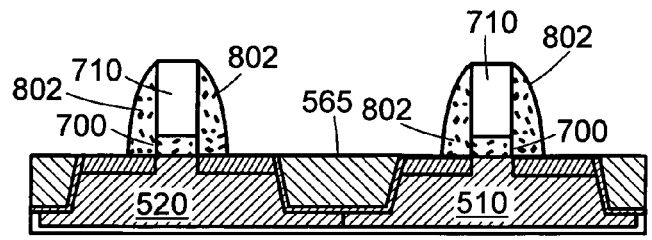
Figure 7C:
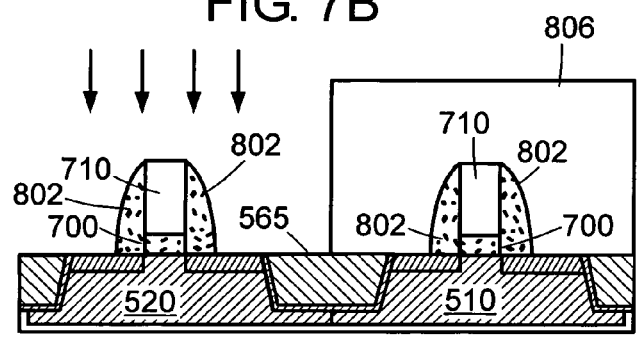
Figure 7D:
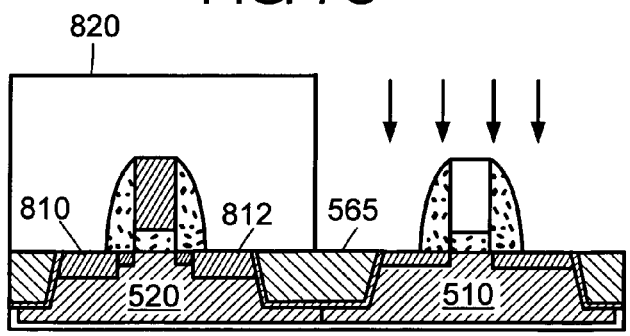
Figure 7E:
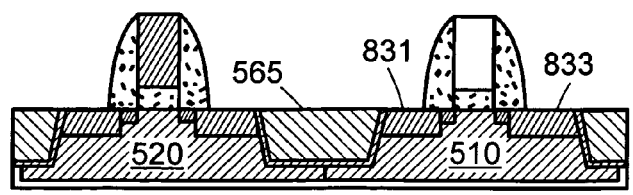

After the gate oxide has been formed, a layer of polysilicon 708 is deposited on top of the oxide film by using a CVD reactor (see FIG. 6B). Then, a photoresist 710 is patterned on top of the polysilicon above where it is intended that the gates will be located (see FIG. 6C). The portions of polysilicon 708 not protected by the photoresist 710 are removed using polysilicon etching process techniques (see FIG. 6D). The remaining photoresist 710 is then removed (see FIG. 6E) and a new layer of photoresist 730 is formed on the wafer and patterned to expose the regions in which the source and drain extensions are to be formed. To form the source and drain extensions 733 for the P-well region, an n-type dopant is implanted (see FIGS. 6F and 6G) while the N-well region is protected by the photoresist 730. Similarly, to form the source and drain extensions 743 for the N-well region, a p-type dopant is implanted (see FIG. 6G and 6H) while the N-well region is protected by another photoresist 740.

Next comes the sidewall and source and drain fabrication phase 480 (see FIG. 2). The process steps of this phase are illustrated in FIGS. 7A–E. First, either an oxide film or a nitride film 800 is deposited, typically by using a CVD process (see FIG. 7A). Then a blanket etch is used to remove most of the oxide or nitride film 800 leaving behind sidewalls 802 on the gate structure (see FIG. 7B). Next, the wafer is covered with a layer of photoresist 806; the photoresist is patterned to expose the P-well regions 520 and protect the N-well regions 510; and an n-type dopant (e.g. arsenic, phosphorous, or antimony) is implanted into the gate poly silicon above P-well region 520 and into the source and drain areas of the P-well regions (see FIG. 7C) to form sources 810 and drains 812 for the P-well regions (see FIG. 7D). The photoresist 806 is removed and a similar sequence of steps is used to form sources 831 and drains 833 of the N-well regions (see FIG. 7E). More specifically, the wafer is again covered with a layer of photoresist 820; the photoresist is patterned to expose the N-well regions 510 and protect the P-well regions 520; and a p-type dopant (e.g. boron) is implanted into the gate poly silicon area 710 above the N-well region and into the source and drain areas of the N-well regions (see FIG. 7D). This forms sources 831 and drains 833 for the N-well regions (see FIG. 7E). And then the second photoresist 820 is removed so that an anneal can be performed to drive in the dopants in the recently implanted source and drain regions (see FIG. 7E). For the annealing process one typically uses either furnace or an RTP system. This is the point at which the wafer is exposed to temperatures that are about 1050° C. After this point in the CMOS fabrication process, the process temperatures will typically not exceed 650° C.

As noted earlier, because the process temperatures will not exceed 650° C. after this anneal, this is an appropriate point at which to fabricate optical detectors that might be destroyed by being exposed to the high annealing temperatures.

Referring back to FIG. 1, the fabrication of the optical detector at this point in the CMOS LSI process requires that a trench be formed down to the region of optical waveguides 30 in silicon substrate 12 that lies below oxide layer 14. Note that the figures distort the relative dimensions of the electrical and optical devices. Typically, the upper silicon layer into which the CMOS devices are fabricated is on the order of 10's of nanometers thick. The silicon layer separating the upper silicon from the underlying silicon that contains the optical circuitry is on the order of several nanometers thick. And the waveguides in the underlying silicon substrate are on the order of 1 to 2 microns thick. In other words, the optical components, relative to their overall size are very close to the surface and they are orders of magnitude larger in the vertical dimension than the overlying CMOS devices.

Note also that there are, as suggested above, different substrates that can be used and the exact transistor and well formation depends on which type of substrate is used. For example, a fully-depleted SOI has only 15 nm of Si on top of the insulating layer, i.e., well formation is very shallow if it is to be practiced at all. Then, there is a partially depleted SOI, epi-substrate, optical-ready epi-wafer produced by layer transfer or by epi-layer growth. Furthermore, there can be several types of transistors fabricated on one die or substrate, e.g. using different gate lengths and/or gate oxide thicknesses.

FIGS. 8A–I illustrate the steps for fabricating one type of optical detector down at the level of SiGe waveguides 1000 in the underlying silicon. These figures show an end view of the optical waveguide which extends in a direction that is perpendicular to the page. In this case, the optical detector that is being fabricated is a SiGe super lattice optical detector, which is particularly vulnerable to being damaged by later exposure to temperatures as low as 850° C.

Figure 8A:
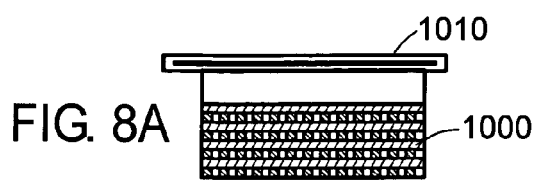
FIGS. 8A–I present a flow chart of the primary steps of the detector fabrication process.
Figure 8F:
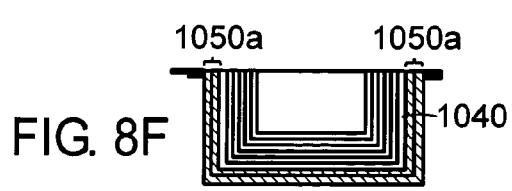
Figure 8B:
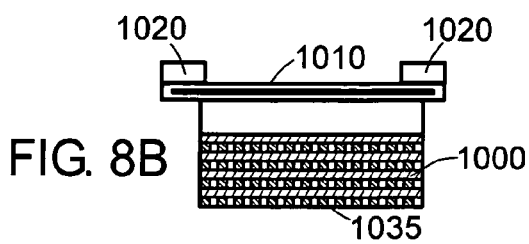
Figure 8G:
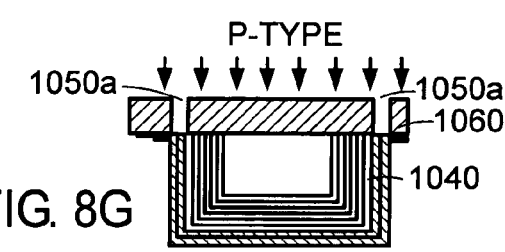
Figure 8C:
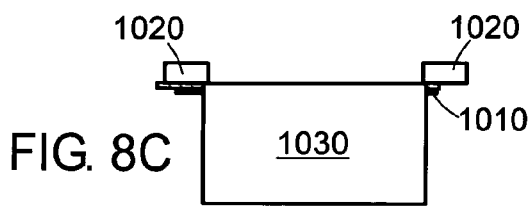
Figure 8H:
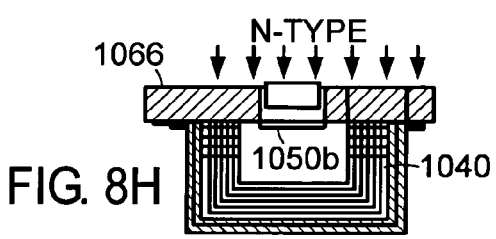
Figure 8D:
Figure 8E:
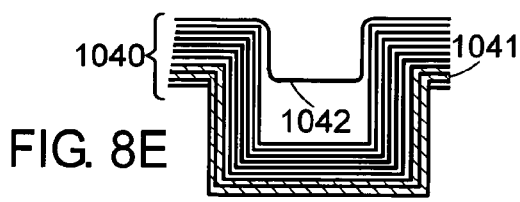
Figure 8I:
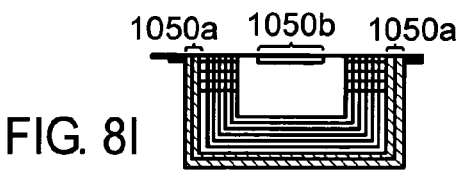

In preparation for fabricating these detectors and to protect the CMOS devices that have been fabricated prior to this point, a sacrificial oxide or nitride layer or other material stack 1010 is first deposited over the surface of the wafer (see FIG. 8A). Next, a layer of photoresist 1020 is deposited on the wafer surface 1020 and patterned to define openings above the locations at which the optical detectors will be fabricated (see FIG. 8B). Then, trenches 1030 are formed by etching away the exposed oxide layer and the underlying silicon (see FIG. 8C). The etch is timed to dig a trench 1030, the depth of which extends at least to the bottom 1035 of optical waveguides 1000 (see FIG. 8B). After trench 1030 is fabricated, photoresist layer 1020 is stripped off and the wafer is ready to fabricate the optical detectors in the trenches (see FIG. 8D).

The SiGe super lattice detector is made up of alternating thin layers of silicon and SiGe. The basic building block of the super lattice is a SiGe layer grown on top of a silicon layer. Because these two materials have slightly different lattice constants, there will be an induced strain in the SiGe layer which changes its band structure so that it absorbs 1200–1300 nm light. The SiGe layer is kept thin enough to sustain the strain without relaxing (e.g. about 6 nm) with the percentage of Ge being at least about 60%. The silicon layer is about 29 nm think. This basic two-layer building block is repeated about 20 times to produce a stack that is about 1 micron high. In the described embodiment, an epitaxial process is used to grow these layers with the composition of the feed gas varied throughout the process to deposit the individual layers (see FIG. 8E).

Multiple layers 1040 of silicon and SiGe are deposited over the entire surface of the wafer and extending down into the trenches that have been formed. The first layer 1041 of multiple layers 1040 is a p-type layer that will function in the completed device as a back contact to the detector structure. The succession of layers that are then formed on that initial p-type layer are alternating layers of silicon and SiGe to form the super lattice structure. After a sufficient number of layers of silicon and SiGe have been deposited, a final n-type layer 1042 is deposited to fill in the rest of the trench. Then, CMP is used to remove the deposited silicon oxide and the layers of the silicon and SiGe that are above the dummy oxide layer that had previously been formed on the surface of the wafer. The CMP, which produces a planarized surface, is halted when the dummy oxide layer is reached (see FIG. 8F). (Alternatively, the SiGe can be deposited selectively in the area of the trench with little or no deposition on the sacrificial layer.) This leaves the p-type layer 1041 exposed in two regions 1050a, one at either side of the detector. These exposed regions 1050a are where the contacts to the backside of the detector will next be formed.

To form the p-type contact to region 1050a, a patterned layer of photoresist 1060 is formed over the surface of the wafer with openings defined at regions 1050a. Then, p-type dopant (e.g. boron) is implanted into region 1050a (see FIG. 8G). After this first implant, photoresist layer 1060 is removed and a second layer of photoresist is applied in preparation for forming an n-type contact 1050b within the n-type region in the center of the trench. To form the n-type contact region 1050b, photoresist layer 1066 is patterned to define openings at region 1050b. Then, n-type dopant (e.g. arsenic) is implanted into region 1050b (see FIG. 8H). Finally, this second layer of photoresist 1066 is removed. To drive the implanted dopants deeper into the corresponding contact regions, an anneal is performed at a temperature of about 650° C.

Note that this same process or a similar process can be used to fabricate other types of detectors which utilize a narrow bandgap such as SiGe alloys or impurity absorption detectors, which are described in U.S. Ser. No. 10/856,127 filed May 28, 2004 and entitled "Impurity-Based Waveguide Detector System," the contents of which are incorporated herein by reference. In addition, detectors of other designs could be integrated into the substrate at this point as well, including for example Schottky detectors, pure Ge detectors, and impurity-based detectors.

Prior to the next phase, which is the silicide phase, the dummy oxide is removed from the surface of the wafer thereby exposing the previously fabricated CMOS structures.

Figure 9:
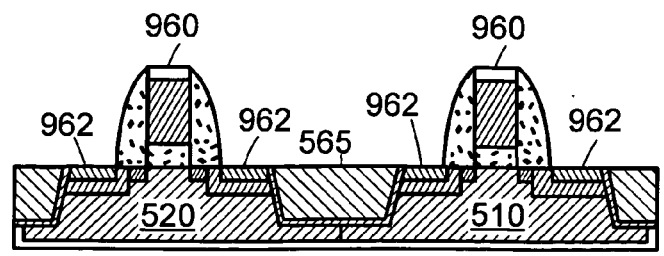
FIG. 9 represents the silicide phase.

Referring to FIG. 9, the silicide phase uses well-know processes for making ohmic contacts to the gates, drains and sources. The silicide is formed by depositing titanium, cobalt, platinum, or nickel on top of the gate posts and the sources and drains of the CMOS devices (see regions 960 and 962 of FIG. 9). In a cobalt silicide process, cobalt is deposited onto the surface of the wafer by means of a plasma vapor deposition (e.g. sputtering). Then, the wafer is rapidly heated to about 450° C. in a atmosphere of forming gas within an RTP system; the wafer is wet etched to remove unwanted films elsewhere; and finally, the wafer is exposed to a second RTP at 800° C. This produces a CoSi2 in the contact regions.

The final phase of the FEOL process (i.e., the W-Plug phase) involves forming the tungsten plugs which will provide electrical connections between the CMOS devices and the metalizations that will later be formed above those devices during the Back End of Line (BEOL) phase.

Figure 10A:
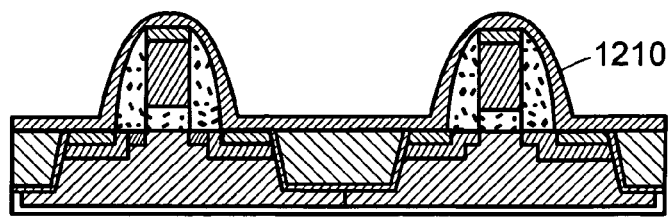
FIGS. 10A–G present a flow chart of the tungsten plug fabrication phase.
Figure 10B:
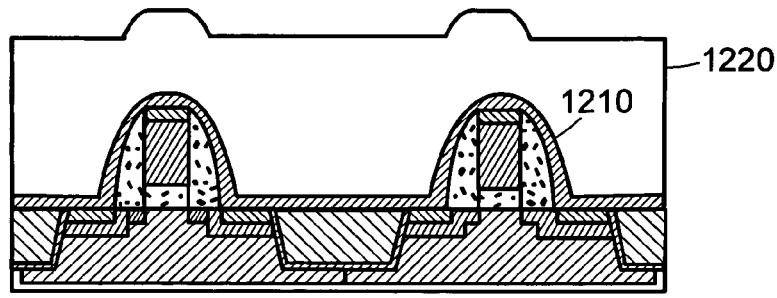
Figure 10C:
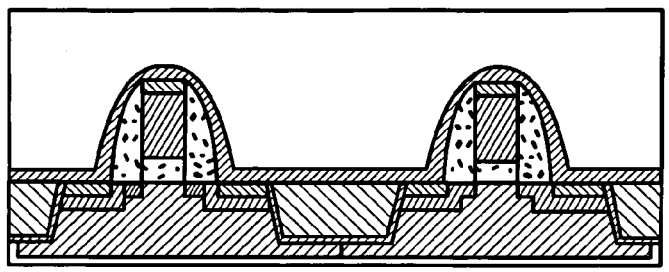
Figure 10D:
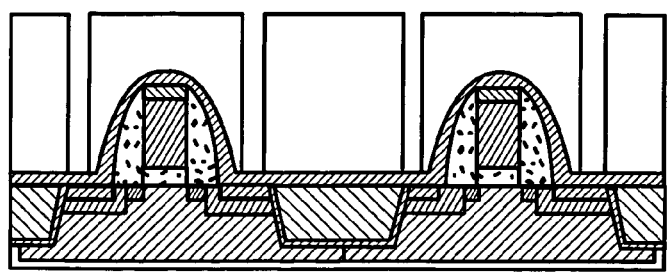
Figure 10E:
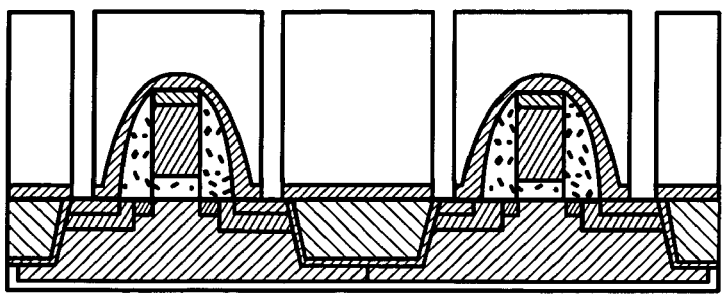
Figure 10F:
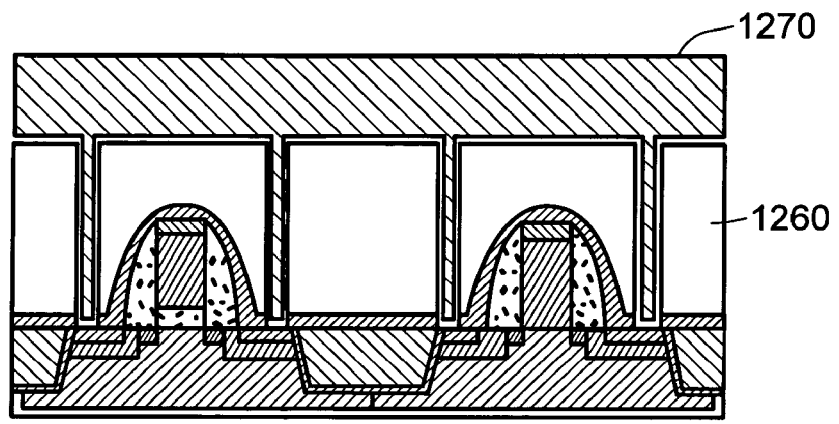
Figure 10G:
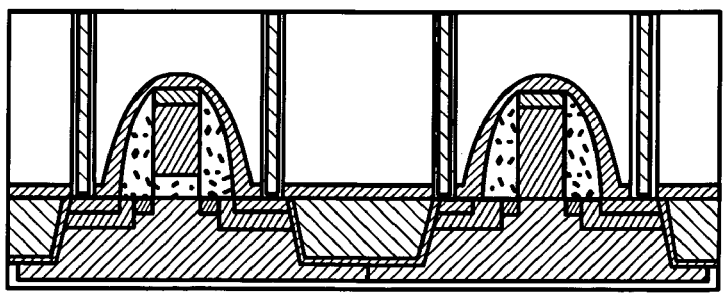

Referring to FIGS. 10A–G, at the beginning of the W-plug phase, a thin etch stopper layer 1210 is deposited onto the surface of the wafer (see FIG. 10A). Next, a thicker layer of doped silicon oxide 1220 is deposited on top of etch stopper layer 1210 (see FIG. 10B). The doped silicon oxide 1220 is deposited using a CVD reactor and the material that is deposited is typically either BSG or BPSG. The wafer is then planarized using CMP (see FIG. 10C) and a patterned layer of photoresist is formed on the planarized surface. The openings in the photoresist layer define the desired locations for the contact holes down to the silicide contact areas in the CMOS devices and into which the tungsten plugs will later be formed. The contact holes are then etched through the silicon oxide and down to etch stopper layer 1210 (see FIG. 10D). Then, using a different etch openings through the etch stopper layer to the silicide regions are formed (see FIG. 1E). With the contact holes now fully formed, a thin layer of a barrier metal 1260, such as titanium or titanium nitride, 1260 is deposited onto the surface of the wafer and into the contact holes. And then, using a CVD reactor, the holes are filled with tungsten (see FIG. 10F). Finally, using CMP the tungsten and the barrier layer material on top of the wafer is removed to leave just the tungsten plugs in the contact holes (see FIG. 10G).

The next phase is the Back End of Line phase during which the metalizations, typically multiple layers of metallization) are formed on top of the substrate and interconnecting the devices.

Perhaps a more general criterion for identifying the appropriate placement of the detector fabrication process in the overall fabrication process for the integrated circuit is what is referred to as "thermal budget." The thermal budget of a process step is the allowable accumulated sequence of temperature applied versus time that can be applied to a given process step without damaging the structures being fabricated. Each subsequent process step will require some temperature be applied for some time and affect the thermal budget of the previous processes. The issue in providing a proper sequence and in the method for determining the order of sequences relates to the thermal budget of the processes. The order of processes is generally determined by first processing the steps that have the highest thermal budget (highest temperature versus time tolerance), and then processing steps with a lower thermal budget for each subsequent step. In this way, the full sequence of processes can be performed without one process damaging the previously fabricated structures.

The portion of the thermal budget that is consumed during any given process phase is determined by the specific amount of time that the wafer is processed at a given temperature (not necessarily the product of temperature and time). For example, a dopant diffusion process will allow dopants to diffuse a distance that grows exponentially with increasing temperature, but only grows as the square root of time. But both temperature and time at that temperature affect the process and both must be considered for their effect. In general, temperature is the dominant effect, but low temperature processes for sufficiently long times can have greater effect than high temperature processes for short times for some process. However, some processes like phase change (melting or solidifying) of a material under a given stress are dominated almost entirely by temperature and the melt will occur very rapidly once the temperature is reached.

For semiconductor fabrication processes there is usually an associated thermal budget that constrains the process temperatures and times that can be used. Individual devices also have associated thermal budgets that cannot be exceeded if the desired device performance is to be achieved. The fabrication of the optical detectors described above is placed within the overall circuit fabrication process so that the thermal budget for the optical detectors is not exceeded by the subsequent processes that will be used to complete the fabrication of the integrated circuit.

Other embodiments are within the following claims.

What is claimed is:

1. A method of fabricating an optical detector, the method comprising:
   providing a substrate that includes an optical waveguide formed therein and having a surface for fabricating microelectronic circuitry thereon;
   fabricating microelectronic circuitry on the surface of the substrate, said fabricating involving a plurality of sequential process phases;
   after a selected one of said plurality of sequential process phases has occurred and before the next process phase after said selected one of said plurality of process phases begins, fabricating an optical detector within the optical waveguide; and
   after fabricating the optical detector in the waveguide, completing the plurality of sequential process phases for fabricating the microelectronic circuitry.

2. The method of claim 1, wherein the optical detector has a thermal budget associated therewith and wherein the selected process phase is chosen so that completing the plurality of sequential process phases after fabricating the optical detector does not exceed the thermal budget of the optical detector.

3. The method of claim 1, wherein the microelectronic circuitry being fabricated has a thermal budget associated therewith and wherein the selected process phase is chosen so that fabricating the optical detector does not exceed the thermal budget for the microelectronic circuitry being fabricated.

4. The method of claim 1, wherein the selected process phase is chosen so that completing the plurality of sequential process phases after fabricating the optical detector does not damage the optical detector.

5. The method of claim 1, wherein the selected process phase is chosen so that fabricating the optical detector does not damage the microelectronic circuitry being fabricated.

6. The method of claim 1, wherein fabricating the optical detector involves employing a maximum process temperature of T(1)max and wherein the selected process phase is chosen to be one of said plurality of process phases during which exposing the substrate to the process temperature of T(1)max will not damage the microelectronic circuitry that is being fabricated on the substrate and after which exposing the substrate to a process temperature of T(1)max will damage microelectronic circuitry that is being fabricated on the substrate.

7. The method of claim 1, wherein process temperatures that are greater than T(1)max are will damage the optical detector and wherein the selected process phase is chosen to be one of said plurality of process phases after which the substrate will be exposed to process temperatures that are no greater than T(1)max.

8. The method of claim 1, wherein fabricating the microelectronic circuitry is in accordance with CMOS fabrication techniques.

9. The method of claim 1, wherein the step of fabricating microelectronic circuitry on the surface of the substrate comprises fabricating microelectronic devices.

10. The method of claim 8, wherein the plurality of sequential process phases includes a silicide phase and wherein the selected one of the process phases occurs before the silicide phase.

11. The method of claim 8, wherein the plurality of sequential process phases includes a thermal treatment to diffuse in dopants in drains and sources of CMOS devices and wherein the selected one of the process phases is the thermal treatment phase.

12. The method of claim 11, wherein the plurality of sequential process phases includes a silicide phase and wherein the selected one of the process phases occurs before the silicide phase.

13. A method of fabricating on optical detector, the method comprising:
   providing a substrate that includes an optical waveguide formed therein and having a surface for fabricating microelectronic circuitry thereon;
   in accordance with a CMOS fabrication process, fabricating microelectronic circuitry on the substrate, said CMOS fabrication process including a plurality a sequential process phases;
   after a selected one of said plurality of sequential process phases has occurred and before the next process phase after said selected one of said plurality of process phases begins, fabricating an optical detector within the optical waveguide; and
   after fabricating the optical detector in the waveguide, completing the plurality of sequential process phases for fabricating the microelectronic circuitry.

14. The method of claim 13, wherein the plurality of sequential process phases includes a silicide phase and wherein the selected one of the process phases occurs before the silicide phase.

15. The method of claim 13, wherein the plurality of sequential process phases includes a thermal treatment to diffuse in dopants in drains and sources of CMOS devices and wherein the selected one of the process phases is the thermal treatment phase.

16. The method of claim 15, wherein the plurality of sequential process phases includes a silicide phase and wherein the selected one of the process phases occurs before the silicide phase.

* * * * *